(12) United States Patent
Sone

(10) Patent No.: US 7,699,618 B2
(45) Date of Patent: Apr. 20, 2010

(54) OPTICAL TRANSCEIVER WITH AN FPC BOARD CONNECTING AN OPTICAL SUBASSEMBLY WITH A CIRCUIT BOARD

(75) Inventor: Hidemi Sone, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 524 days.

(21) Appl. No.: 11/802,918

(22) Filed: May 25, 2007

(65) Prior Publication Data

US 2007/0286553 A1 Dec. 13, 2007

(30) Foreign Application Priority Data

May 26, 2006 (JP) .............................. 2006-146217

(51) Int. Cl.
*H01R 12/00* (2006.01)
(52) U.S. Cl. .............................. 439/67; 385/92; 385/88; 385/89; 174/52.1
(58) Field of Classification Search .................. 439/67, 439/77, 492; 385/92, 88, 93, 94, 89, 14; 174/52.1, 59, 60, 61
See application file for complete search history.

(56) References Cited

U.S. PATENT DOCUMENTS

| 5,295,214 | A | 3/1994 | Card et al. |
| 7,137,744 | B2* | 11/2006 | Wang et al. .................... 385/89 |
| 2003/0142929 | A1* | 7/2003 | Bartur et al. ................... 385/92 |
| 2005/0191057 | A1* | 9/2005 | Nakamoto et al. ........... 398/135 |
| 2005/0276547 | A1* | 12/2005 | Wang et al. .................... 385/92 |
| 2007/0058980 | A1* | 3/2007 | Hidaka ......................... 398/138 |
| 2007/0089900 | A1* | 4/2007 | Mitamura et al. ........... 174/254 |

* cited by examiner

*Primary Examiner*—Gary F. Paumen
(74) *Attorney, Agent, or Firm*—Venable LLP; Michael A. Sartori

(57) ABSTRACT

The specification discloses an optical transceiver that provides a FPC board to electrically connect the OSA with the circuit board. The FPC board provides pads to be connected with corresponding pads formed on the circuit board and at least one opening in adjacent to the pads. In the present invention, the shape and the position of the opening fit with the outer shape and the position of a corresponding electrical component mounted on the circuit board. By mating the opening in the FPC board with the component on the circuit board, the pads on the FPC board may be aligned with pads on the circuit board.

8 Claims, 7 Drawing Sheets

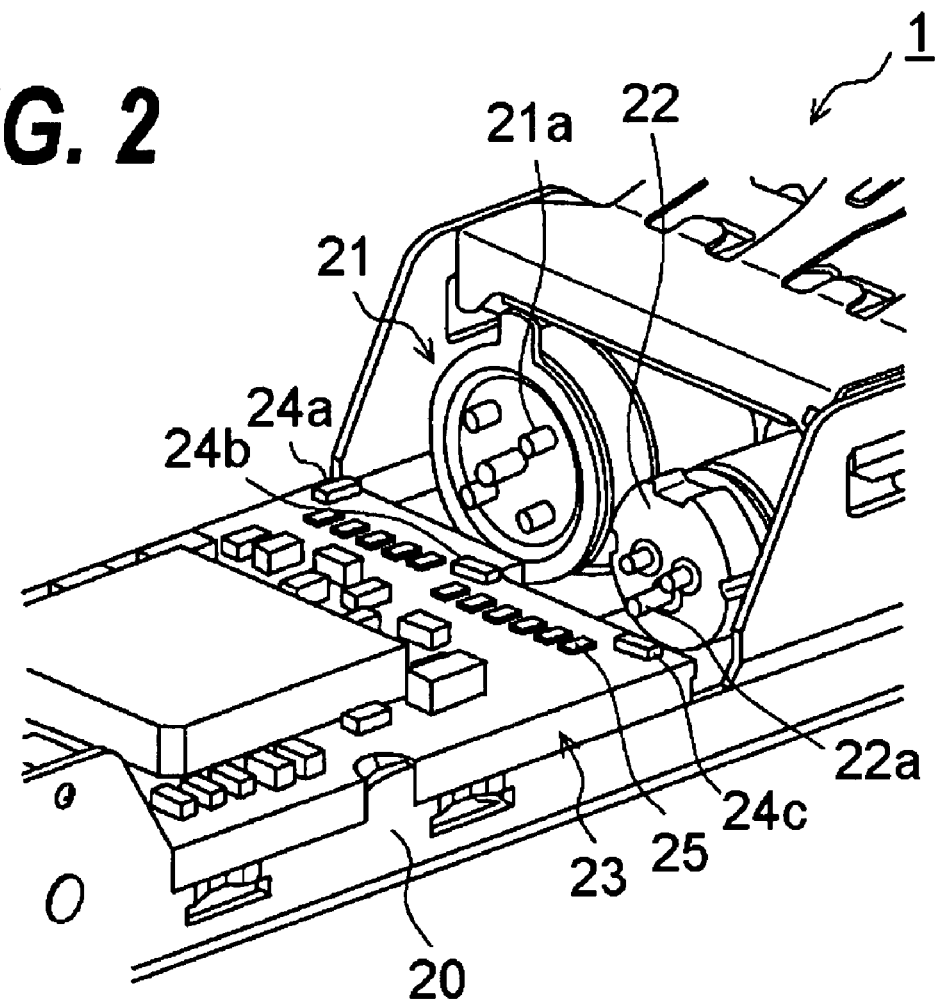

OPTICAL TRANSCEIVER WITH AN FPC BOARD CONNECTING AN OPTICAL SUBASSEMBLY WITH A CIRCUIT BOARD

BACKGROUND OF THE INVENTION

1. Field of the Invention

The present invention relates to an optical transceiver, in particular, the invention related to an optical transceiver providing a flexible printed circuit (FPC) board to electrically connect an optical subassembly with a circuit board.

2. Related Prior Art

Typical optical transceiver provides an optical subassembly (OSA), which installs a semiconductor optical device and a circuit board electrically connected with the OSA. The OSA, by receiving an optical connector that provides an optical fiber therein, optically communicates with the optical fiber by the semiconductor optical device, and the optical device converts thus received optical signal into a corresponding electrical signal, or an externally received electrical signal into the optical signal to be propagated within the optical fiber.

One type of the OSA includes a laser diode (LD) to emit optical signal and a photodiode (PD) to monitor the optical signal from the LD, which is often called as a transmitter optical sub-assembly (TOSA). Another type of the OSA includes a photodiode to receive the optical signal transmitted in the optical fiber and to convert the optical signal into an electrical signal, and a pre-amplifier to amplify the electrical signal, which is often called as a receiver optical sub-assembly (ROSA). The optical transceiver generally comprises these OSAs, the TOSA and the ROSA, the circuit board, a frame for mounting the OSAs and the circuit board, and a cover for enclosing these OSAs, the circuit board and the frame. The electrical connection between the OSAs and the circuit board is generally performed by the FPC board. The United States patent, U.S. Pat. No. 5,295,214 has disclosed an exemplary configuration of the FPC board and the circuit board connected with the FPC board.

FIG. 7 is a perspective view showing another conventional configuration of the FPC board. In this conventional configuration, the FPC board 70 is connected in the top surface thereof with the back surface of the circuit board. The circuit board 83 provides a plurality of pads in the back surface, the surface not illustrated in FIG. 7, while, the FPC board 70 provides pads in the top surface. Thus, the FPC board 70 is connected in the top surface thereof with the back surface of the circuit board 83.

However, the conventional FPC board mentioned above aligns its position by the visual inspection or by using a special tool, which prolongs the alignment and makes it troublesome, finally results in the increase of the process cost. Moreover, the alignment of the FPC board relies on the outer shape of the circuit board and that of the FPC board, which means that various tools are necessary for respective circuit board and the FPC board and makes it complex to control or manage the manufacturing process.

The precise alignment using the special tool and the visual inspection has a substantial subject in addition to the prolonged procedure in the process. That is, a conventional transceiver installs the circuit board with the FPC board within the frame after the connection of two boards. Without careful handling of the assembly of two boards, unexpected stress may be induced in soldered portions of two boards, which may break the soldered portion between two boards by the stress.

Additional member such as resin to reinforce and to cover the soldered portion are often used to relax the stress induced in the soldered portion, or dummy pads, which are electrically connected nowhere, may be provided in adjacent to the practical pads connecting two boards. When the FPC board is bent in advance to the assembly so as to facilitate the assembling process, the alignment between tow boards becomes hard. The process to bring the additional resin requires an auxiliary time to apply and to solidify the resin, which increases the process cost.

SUMMARY OF THE INVENTION

An optical transceiver according to the present invention includes an optical subassembly, a circuit board and a flexible printed circuit (FPC) board for electrically connecting the optical subassembly with the circuit board. The FPC board provides at least one opening, while, the circuit board mounts an electrical component thereon. The outer shape and the position of the electrical component may be fitted with the shape of the opening in the FPC board. By mating the electrical component on the circuit board with the opening in the FPC board, the FPC board may be positioned with the circuit board in self-aligned configuration.

The FPC board provides a pad, while the circuit board also provides a pad to be soldered with the pad in the FPC board. The opening in the FPC board may be positioned in adjacent to the pad, thus, the positional accuracy between the pad in the FPC board and that of the circuit board may be enhanced.

The electrical component on the circuit board may be a chip component with a rectangular outer shape, while, the opening in the FPC board may have a rectangular shape to be fitted with the rectangular chip component. Thus, at leas one opening with the rectangular shape may enhance the positional accuracy of the FPC board with respect to the circuit board.

BRIEF DESCRIPTION OF DRAWINGS

FIG. 2 is a perspective view showing two OSAs, the circuit board to be connected with OSAs by the FPC board, and the frame mounting the OSAs and the circuit board;

DESCRIPTION OF PREFERRED EMBODIMENTS

Figure 1:
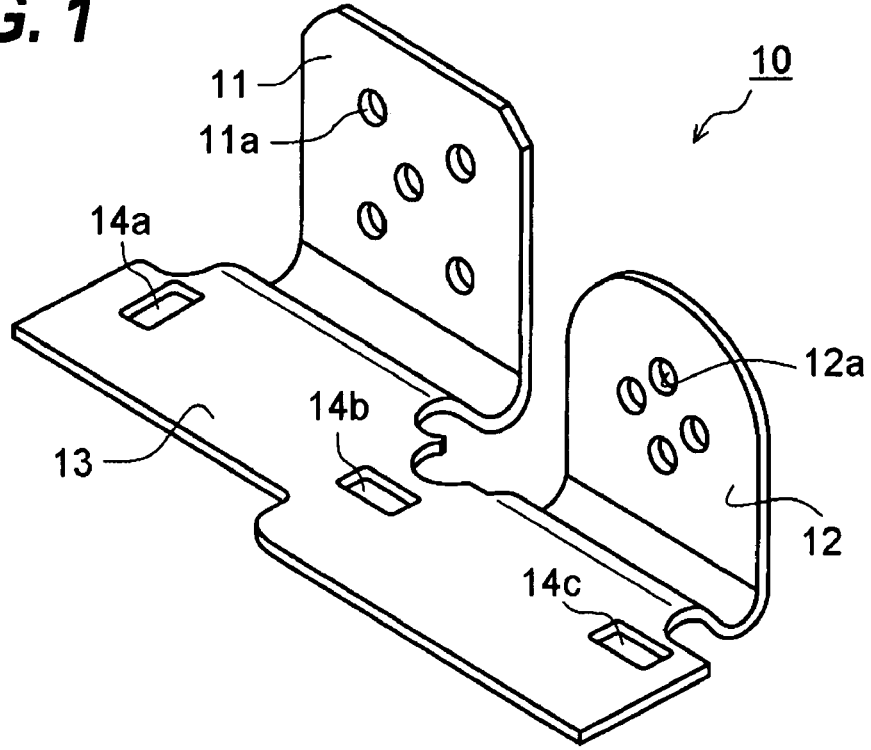
FIG. 1 is a perspective view showing a FPC board according to the present invention.
Figure 3A:
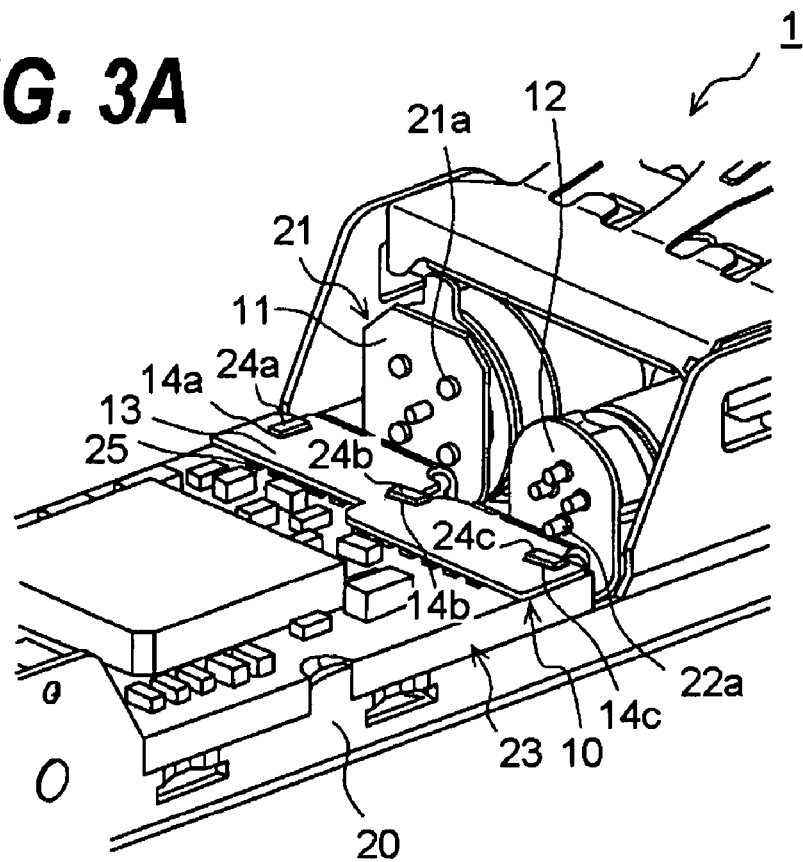
FIG. 3A is a perspective view.
Figure 3B:
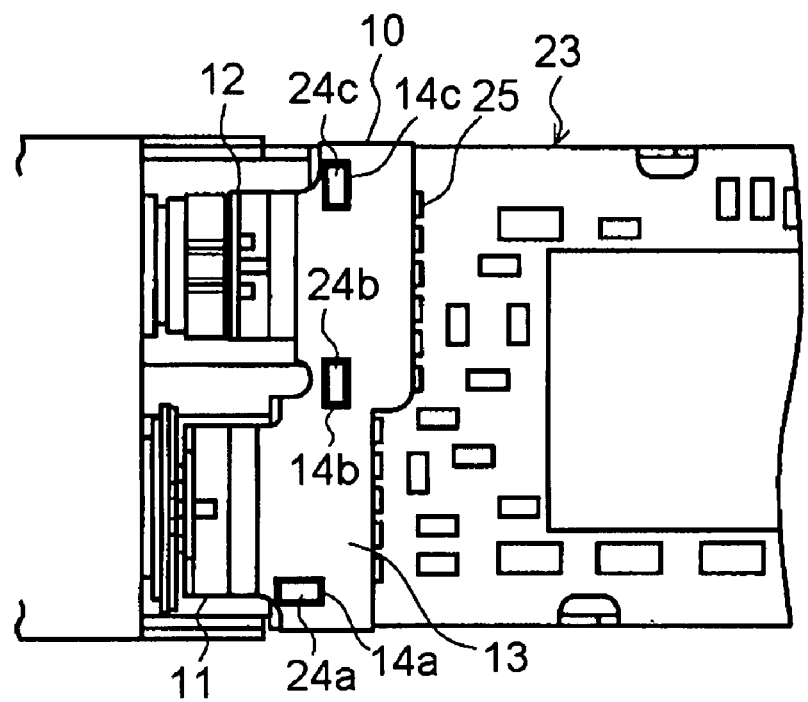
FIG. 3B is a plan view of two OSAs, the circuit board, and the frame, where the OSAs are connected with the circuit board by the FPC board of the present invention.

FIG. 1 shows an example of a flexible printed circuit (FPC) board according to an embodiment of the present invention, which connects an optical sub-assembly (OSA) with a circuit board within an optical transceiver. FIG. 2 is a perspective view of the OSA and the circuit board with a frame of the optical transceiver, which are to be connected to each other by the FPC board of the present invention. FIG. 3A is a perspective view of the OSA and the circuit board each connected by the FPC board of the present invention, while FIG. 3B is a top view of those members.

The optical transceiver 1 includes two OSAs, a ROSA 21 and a TOSA 22, a circuit board 23 that mounts integrated circuits IC, and a flexible printed circuit (FPC) board 10 that connects the ROSA 21 with the circuit board 23 and the TOSA 22 with the circuit board 23. Another member of the transceiver 1, which may be called as a frame 20, is assembled with those members, two OSAs, 21 and 22, and the circuit board 23 after the connection of the ROSA 21 and the TOSA 22 with the circuit board 23 by the FPC board 10. The FPC board 10 originally shapes in flat and, as shown in FIG. 1, the board 10 connects the OSAs, 21 and 22, with the circuit board 23 as being bent in the L-shape.

The FPC 10 provides a plurality of holes, 11a and 12a, in first and second portions, 11 and 12, respectively, where the former holes 11a in the first portion 11 receive the lead pins 21a of the ROSA 21 while the latter holes 12a in the second portion 12 receive the lead pins 22a of the TOSA 22. The FPC further provides a third portion 13 to which the circuit board 23 is to be connected. Although not shown in FIG. 1, the third portion provides a plurality of pads in the back surface thereof. The shapes of these pads in the back surface are similar to those pads 25 shown in FIG. 2. These pads are to be connected with pads 25 formed on the circuit board 23, which performs the electrical connection between the OSAs, 21 and 22, and the circuit board 23.

The FPC board 10 in the present invention further provides openings, 14a to 14c, adjacent to the pads in the third portion 13. FIG. 1 illustrates three openings, 14a to 14c, at least one opening may shows a function of the present invention. The shapes and positions of the holes, 14a to 14c, fit with an external form and a position of components, 24a to 24c, mounted on the circuit board 23.

Thus, the FPC according to the present embodiment provides openings, 14a to 14c, adjacent to pads to be soldered with corresponding pads on the circuit board 23 and the position and the shape of the openings fit with the outer shape and the position of electronic components, 24a to 24c, mounted on the circuit board 23, which enables the FPC board 10 to be assembled with the circuit board 23 without any specific tools. In the present embodiment, the electrical components, 24a to 24c, may be a chip component with a rectangular outer shape and the openings, 14a to 14c, in the FPC board has a rectangular shape to be fitted with the chip components on the circuit board 23. That is, the present FPC board 10 may be soldered with the pads on the circuit board 23 in the self-aligned configuration.

The visual inspection using the CCD camera for mounting the electronic components on the circuit board may realize the positional accuracy of +/−0.05 mm, which is superior to the dimensional accuracy of the outer shape of the circuit board. Moreover, the FPC board 10 according to the present invention may provide the openings for the assembly in very close to the pads to be soldered with corresponding pads on the circuit board, which further enhances the positional accuracy of the FPC board 10. That is, the opening closer to the pads for the soldering may compensate the failure in the workability even when the FPC board is bent. Moreover, the openings in the FPC board may fit with the electronic components soldered on the circuit board, which saves the cost of the transceiver because the configuration thereof makes it unnecessary for the specific components for the positioning.

Figure 4:
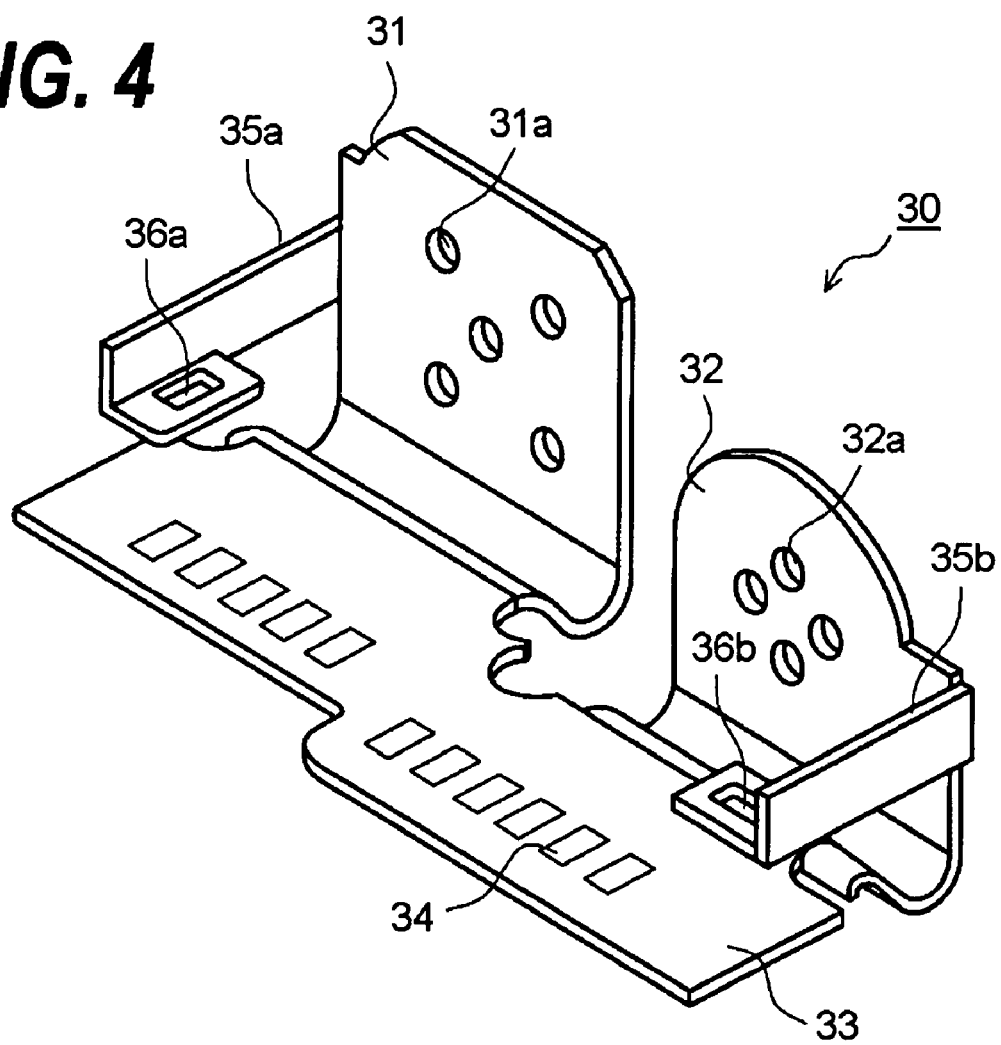
FIG. 4 is a perspective view of a FPC board according to another embodiment of the present invention.
Figure 5A:
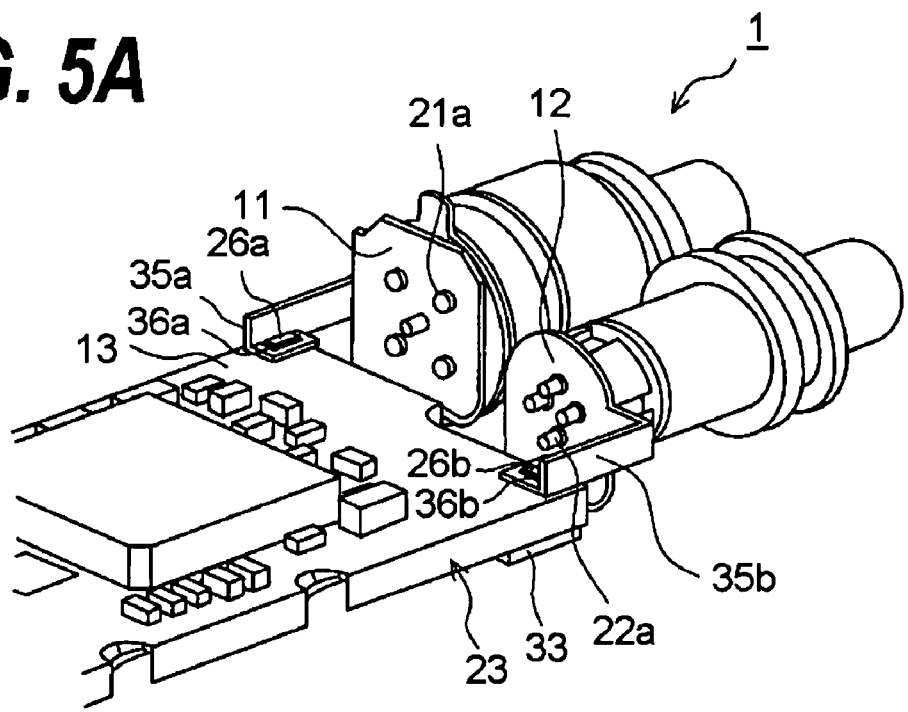
FIG. 5A is a perspective view showing two OSAs, the circuit board connected with the OSAs by the FPC board shown in FIG. 4.
Figure 5B:
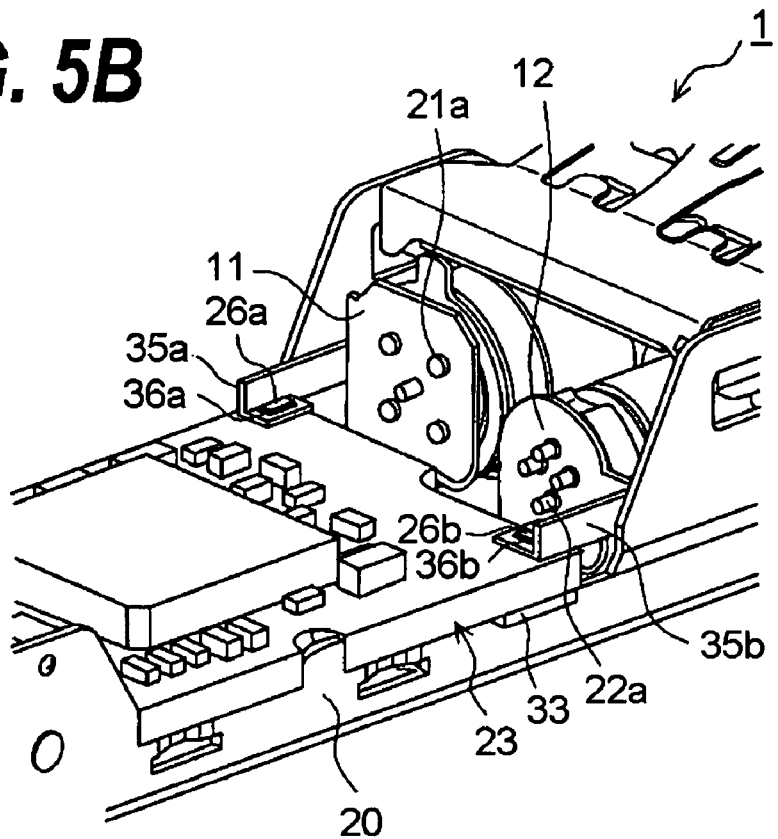
FIG. 5B is a perspective view showing an assembly of two OSAs with the circuit board both mounted on the frame.
Figure 6:
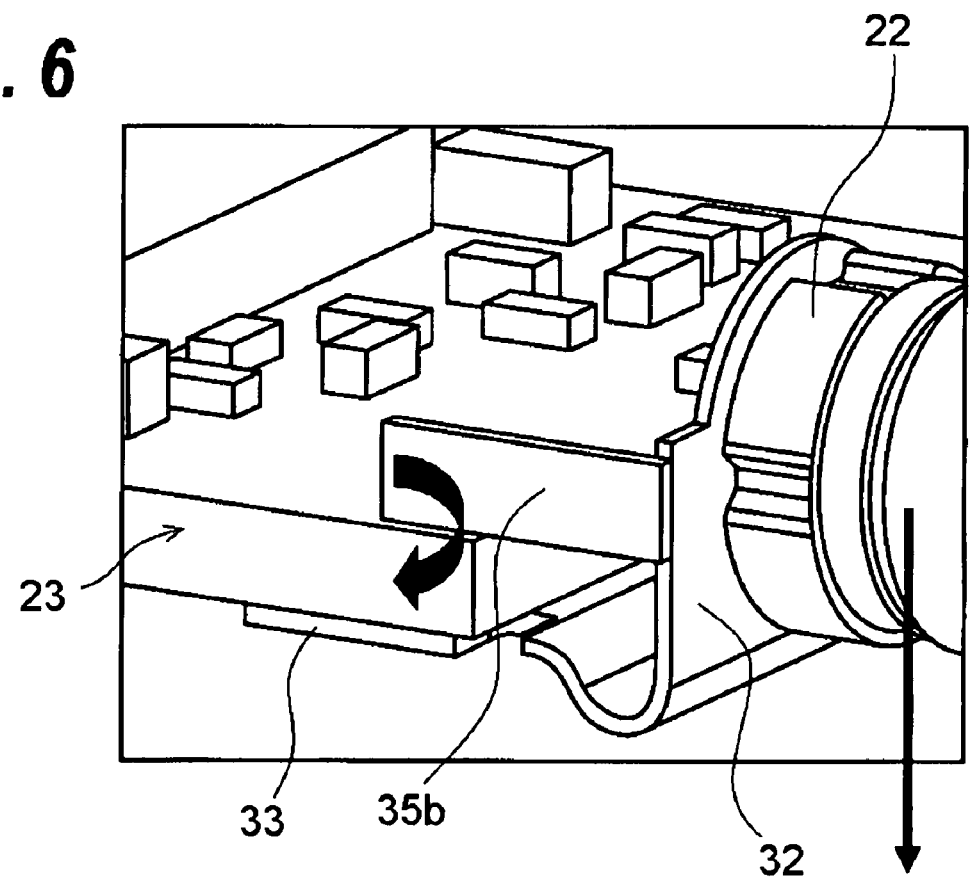
FIG. 6 magnifies a portion of the FPC board shown in FIGS. 5A and 5B soldered with the circuit board.
Figure 7:
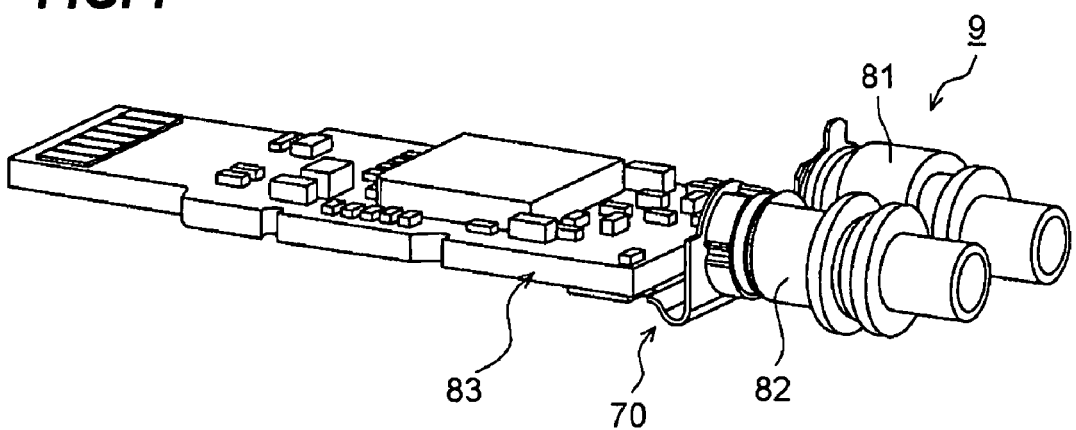
FIG. 7 shows a conventional configuration of the FPC board connecting the OSAs with the circuit board.

FIG. 4 is a perspective view showing another embodiment of the FPC board to connect the OSAs with the circuit board, FIGS. 5A and 5B show the OSAs assembled with the circuit board by the FPC board of the second embodiment, and FIG. 6 magnifies the FPC board. FIG. 5A is a view without the frame, while FIG. 5B is a view with the frame.

The optical transceiver 1 connects the ROSA 21 and the TOSA 22 with the circuit board 23 by the FPC board 30 instead of the board 10 shown in FIGS. 1 to 3. The frame 20 in the present embodiment is also assembled with the circuit board 23 and the OSAs, 21 and 22, after the connection therebetween by the FPC board 30. The FPC board 30 of the present embodiment also originally shapes in flat, and is connected with the OSAs, 21 and 22, and with the circuit board 23 as being bent in several positions as shown in FIG. 4.

The FPC board 30 provides a plurality of holes 31a that receives the lead pin of the ROSA 21 in the first portion 31 to which the ROSA 21 is set and a plurality of holes 32a in the second portion to which the TOSA 22 is set. Moreover, the FPC board 30 provides a plurality of pads 34 in the top surface of the third portion 33 to which the corresponding pads in the back surface of the circuit board are to be connected. Thus, the OSAs, 21 and 22, may be electrically connected with the circuit board 23 by the FPC board 30.

The FPC board 30 according to the present embodiment provides the openings, 36a and 36b, in a portion except for the third portion 33 where the pads 34 are formed. These openings, 36a and 36b, may fit with electronic components, 26a and 26b, mounted on the circuit board.

That is, the shape of the openings, 36a and 36b, and the positions thereof are configured such that the position and the shape of the opening may mate with the electronic component mounted on the circuit board as the FPC board 30 is bent to connect the pad thereof with the corresponding pad on the circuit board 23. As FIG. 4 illustrates, each arms, 35a and 35b, extending from the side of the first 31 or second 32 portion of the FPC board 30 may form the openings, 36a or 36b. This embodiment shown in FIGS. 4 to 6 forms the openings, 36a and 36b, in a portion not adjacent to the pads 34.

Thus, the present FPC board 30 provides at least one opening, 36a or 36b, in a position apart from the pad to be soldered to the pad on the circuit board 23 in order to maintain its bent shape. The FPC board 30 is held in the bent shape, which may save additional members to reinforce the bent shape of the board 23 and may enhance the workability to assemble the OSAs, 21 and 22, assembled with the circuit board 23 within the frame 20.

Moreover, the present combination of the openings, 36a and 36b, with the components on the circuit board 23 may determine the position of the FPC board 30 with respect to the circuit board 23, or to the frame 20, which suppress the mechanical stress from concentrating on the soldered portion between the pads on the FPC board 30 and those formed on the circuit board 23.

Thus, according to the embodiments described above, even the OSA connected with the FPC board moves up and down or right and left, the combination of the opening and the component fit to the opening may absorb the stress due to this displacement of the OSA, which may escape the pad soldered with the corresponding pad on the circuit board from receiving the damage. Accordingly, even in the assembling process of the transceiver, the FPC board may become free from the restriction in the shape and the position thereof, which enhances the workability of the FPC board and may reduce the process cost. Moreover, the combination of the opening and the component fit to the opening has it unnecessary to reinforce the soldered portion with the resin, which may also save the process cost and may increase the area where the electronic components are to be mounted.

I claim:

1. An optical transceiver, comprising:
   an optical subassembly that installs a semiconductor optical device therein;
   a circuit board that installs an electronic circuit coupled with the semiconductor optical device within the optical subassembly, the circuit board mounting an electrical component thereon; and
   a flexible printed circuit board that electrically connects the optical subassembly with the circuit board, the flexible printed circuit board providing at least one opening with a shape and a position, the shape of the opening being fitted with an outer shape of the electrical component on the circuit board and the position of the opening being aligned with a position of the electrical component on the circuit board.

2. The optical transceiver according to claim 1,
   wherein the flexible printed circuit board further providing a pad in adjacent to at least one opening, and
   wherein the circuit board providing a pad corresponding to the pad in the FPC board, the circuit board being electrically connected with the FPC board by connecting the pad on the circuit board with the pad in the FPC board by soldering.

3. The optical transceiver according to claim 2,
   wherein the pad in the flexible printed circuit board is formed in the back surface of the flexible printed circuit board, and the pad in the circuit board is formed in a top surface of the circuit board.

4. The optical transceiver according to claim 1,
   wherein the electrical component mounted on the circuit board is a chip component with a rectangular outer shape, and
   wherein at least one opening provided in the board has a rectangular shape to be fitted with the rectangular outer shape of the chip component on the circuit board.

5. The optical transceiver according to claim 1,
   wherein the flexible printed circuit board provides a first portion facing the optical subassembly and a second portion facing the circuit board, the flexible printed circuit board being bent in substantially right angle at a portion between the first and second portions, and
   wherein at least one opening is formed in the second portion of the flexible printed circuit board.

6. The optical transceiver according to claim 5,
   wherein the first portion provides an extended portion, at least one opening being formed in the extended portion.

7. The optical transceiver according to claim 6,
   wherein the second portion of the flexible printed circuit board provides a pad in a top surface of the second portion,
   wherein the circuit board providing a pad to be connected with the pad in the flexible printed circuit board in a back surface thereof, and
   wherein the extended portion and the second portion of the flexible printed circuit board sandwich the circuit board therebetween.

8. The optical transceiver according to claim 5,
   wherein the electrical component on the circuit board is a chip component with a rectangular outer shape, and
   wherein at least one opening provided in the flexible printed circuit board has a rectangular shape to be fitted with the rectangular outer shape of the chip component on the circuit board.

* * * * *